(12) United States Patent
Suwa et al.

(10) Patent No.: US 8,294,356 B2
(45) Date of Patent: Oct. 23, 2012

(54) LIGHT-EMITTING ELEMENT LAMP AND LIGHTING EQUIPMENT

(75) Inventors: Takumi Suwa, Yokosuka (JP); Toshiya Tanaka, Yokosuka (JP); Takeshi Hisayasu, Yokosuka (JP); Shigeru Osawa, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 0 days.

(21) Appl. No.: 12/933,969

(22) PCT Filed: Jun. 4, 2009

(86) PCT No.: PCT/JP2009/060256
§ 371 (c)(1),
(2), (4) Date: Nov. 12, 2010

(87) PCT Pub. No.: WO2009/157285
PCT Pub. Date: Dec. 30, 2009

(65) Prior Publication Data
US 2011/0089806 A1 Apr. 21, 2011

(30) Foreign Application Priority Data
Jun. 27, 2008 (JP) .................................. 2008-168897

(51) Int. Cl.
*H01J 1/62* (2006.01)
*H01J 63/04* (2006.01)
(52) U.S. Cl. .......... 313/498; 313/46; 313/493; 313/512; 313/634
(58) Field of Classification Search .............. 313/44–46, 313/113, 493, 498, 512, 634, 318.01
See application file for complete search history.

(56) References Cited

U.S. PATENT DOCUMENTS
1,972,790 A 9/1934 Olley
(Continued)

FOREIGN PATENT DOCUMENTS
CN 101307887 11/2008
(Continued)

OTHER PUBLICATIONS
English Language Abstract of JP 2001-243809, published Sep. 7, 2001.
(Continued)

*Primary Examiner* — Anh Mai
*Assistant Examiner* — Kevin Quarterman
(74) *Attorney, Agent, or Firm* — DLA Piper LLP US

(57) ABSTRACT

The present invention provides a light-emitting element lamp 1 capable of preventing a temperature rise of a substrate 9, on which light-emitting elements 4 are mounted, by effectively utilizing a thermally conductive casing 2 and a thermally conductive cover 5.
The light emitting element lamp 1 includes a thermally conductive casing 2, a light source part 3, a thermally conductive cover 5, and an insulative cover 6. The thermally conductive casing 2 includes an irradiation opening 2b, is formed so as to be widened toward the irradiation opening 2b, has its outer circumferential surface exposed outwardly, and has a substrate mounting part 2c secured on its inner circumferential surface. The light source part 3 has a substrate 9 having the light-emitting elements 4 mounted thereon and causes the substrate 9 to be thermally coupled to and attached to the substrate mounting part 2c of the thermally conductive casing 2. The thermally conductive cover 5 is thermally coupled to and connected to the outer circumferential surface of the thermally conductive casing 2 in a surface-contacted state. The insulative cover 6 has one end side thereof connected to the thermally conductive cover 5, and the cap 7 is connected to the other end side thereof. The lighting circuit 12 controls lighting of the light-emitting elements 4 accommodated in the insulative cover 6.

5 Claims, 3 Drawing Sheets

U.S. PATENT DOCUMENTS

| | | | |
|---|---|---|---|
| 4,355,853 A | 10/1982 | Kourimsky | |
| 4,503,360 A | 3/1985 | Bedel | |
| 4,630,182 A | 12/1986 | Moroi | |
| 4,939,420 A | 7/1990 | Lim | |
| D356,107 S | 3/1995 | Watanabe et al. | |
| 5,537,301 A | 7/1996 | Martich | |
| 5,556,584 A | 9/1996 | Yamazaki | |
| 5,585,697 A | 12/1996 | Cote | |
| 5,632,551 A | 5/1997 | Roney | |
| 5,775,792 A | 7/1998 | Wiese | |
| 5,785,418 A | 7/1998 | Hochstein | |
| 5,857,767 A | 1/1999 | Hochstein | |
| 5,947,588 A | 9/1999 | Huang | |
| 6,095,668 A | 8/2000 | Rykowski et al. | |
| 6,161,910 A | 12/2000 | Reisenauer | |
| 6,186,646 B1 | 2/2001 | Wiedemer | |
| 6,234,649 B1 | 5/2001 | Katougi | |
| 6,294,973 B1 | 9/2001 | Kimura | |
| 6,502,968 B1 | 1/2003 | Simon | |
| 6,517,217 B1 | 2/2003 | Liao | |
| 6,598,996 B1 | 7/2003 | Lodhie | |
| 6,814,470 B2 | 11/2004 | Rizkin et al. | |
| 6,936,855 B1 | 8/2005 | Harrah | |
| 6,948,829 B2 | 9/2005 | Verdes et al. | |
| 6,982,518 B2 | 1/2006 | Chou et al. | |
| 7,059,748 B2 | 6/2006 | Coushaine | |
| 7,074,104 B2 | 7/2006 | Itaya | |
| 7,111,961 B2 | 9/2006 | Trenchard | |
| 7,125,146 B2 | 10/2006 | Willis | |
| 7,144,140 B2 | 12/2006 | Sun et al. | |
| D534,665 S | 1/2007 | Egawa et al. | |
| D535,038 S | 1/2007 | Egawa et al. | |
| 7,198,387 B1 | 4/2007 | Gloisten et al. | |
| 7,226,189 B2 | 6/2007 | Lee et al. | |
| 7,281,818 B2 | 10/2007 | You | |
| 7,300,173 B2 | 11/2007 | Catalano | |
| 7,329,024 B2 | 2/2008 | Lynch | |
| 7,331,689 B2 | 2/2008 | Chen | |
| 7,347,589 B2 | 3/2008 | Ge | |
| 7,431,477 B2 | 10/2008 | Chou et al. | |
| 7,497,596 B2 | 3/2009 | Ge | |
| 7,631,987 B2 * | 12/2009 | Wei | 362/294 |
| 7,679,096 B1 | 3/2010 | Ruffin | |
| 7,919,339 B2 | 4/2011 | Hsu | |
| 7,947,596 B2 | 5/2011 | Takeda | |
| 8,058,784 B2 | 11/2011 | Treurniet | |
| 2002/0024814 A1 | 2/2002 | Matsuba | |
| 2003/0117801 A1 | 6/2003 | Lin | |
| 2003/0137838 A1 | 7/2003 | Rizkin et al. | |
| 2003/0151917 A1 | 8/2003 | Daughtry | |
| 2004/0012955 A1 | 1/2004 | Hsieh | |
| 2004/0109310 A1 | 6/2004 | Galli | |
| 2004/0120156 A1 | 6/2004 | Ryan | |
| 2004/0145898 A1 | 7/2004 | Ase et al. | |
| 2004/0156191 A1 | 8/2004 | Biasoli | |
| 2004/0218385 A1 | 11/2004 | Tomiyoshi | |
| 2005/0007772 A1 | 1/2005 | Yen | |
| 2005/0024864 A1 | 2/2005 | Galli | |
| 2005/0068776 A1 | 3/2005 | Ge | |
| 2005/0073244 A1 | 4/2005 | Chou et al. | |
| 2005/0111234 A1 | 5/2005 | Martin et al. | |
| 2005/0162864 A1 | 7/2005 | Verdes et al. | |
| 2005/0174769 A1 | 8/2005 | Yong | |
| 2005/0243552 A1 * | 11/2005 | Maxik | 362/249 |
| 2005/0254246 A1 | 11/2005 | Huang | |
| 2006/0043546 A1 | 3/2006 | Kraus | |
| 2006/0092640 A1 | 5/2006 | Li | |
| 2006/0193130 A1 | 8/2006 | Ishibashi | |
| 2006/0193139 A1 | 8/2006 | Sun | |
| 2006/0198147 A1 | 9/2006 | Ge | |
| 2006/0215408 A1 | 9/2006 | Lee | |
| 2006/0227558 A1 * | 10/2006 | Osawa et al. | 362/351 |
| 2006/0239002 A1 | 10/2006 | Chou et al. | |
| 2007/0002570 A1 | 1/2007 | Souza | |
| 2007/0041182 A1 | 2/2007 | Ge et al. | |
| 2007/0096114 A1 | 5/2007 | Aoki | |
| 2007/0279903 A1 | 12/2007 | Negley | |
| 2008/0037255 A1 | 2/2008 | Wang | |
| 2008/0084701 A1 | 4/2008 | Van De Ven | |
| 2008/0112170 A1 | 5/2008 | Trott | |
| 2008/0130298 A1 | 6/2008 | Negley | |
| 2009/0059595 A1 | 3/2009 | Ge | |
| 2009/0116229 A1 * | 5/2009 | Dalton et al. | 362/191 |
| 2009/0116231 A1 * | 5/2009 | Miller | 362/208 |
| 2009/0184616 A1 | 7/2009 | Van De Ven | |
| 2009/0184646 A1 * | 7/2009 | Devaney et al. | 315/113 |
| 2009/0207602 A1 | 8/2009 | Reed | |
| 2009/0294780 A1 | 12/2009 | Chou | |
| 2010/0026157 A1 | 2/2010 | Tanaka | |
| 2010/0096992 A1 | 4/2010 | Yamamoto | |
| 2010/0207534 A1 | 8/2010 | Dowling | |
| 2010/0219735 A1 | 9/2010 | Sakai et al. | |
| 2010/0225220 A1 | 9/2010 | Tanaka et al. | |
| 2010/0237761 A1 | 9/2010 | Osawa et al. | |
| 2010/0237779 A1 | 9/2010 | Osawa et al. | |
| 2010/0244650 A1 | 9/2010 | Osawa et al. | |
| 2010/0244694 A1 | 9/2010 | Osawa et al. | |
| 2010/0253200 A1 | 10/2010 | Osawa et al. | |
| 2010/0277082 A1 | 11/2010 | Reed | |
| 2010/0289393 A1 | 11/2010 | Cantrell et al. | |
| 2010/0289396 A1 | 11/2010 | Osawa | |
| 2010/0327746 A1 | 12/2010 | Hisayasu | |
| 2010/0327751 A1 | 12/2010 | Takenaka et al. | |
| 2011/0025206 A1 | 2/2011 | Hiramatsu et al. | |
| 2011/0063842 A1 | 3/2011 | Takei et al. | |
| 2011/0068674 A1 | 3/2011 | Takenaka et al. | |
| 2011/0074269 A1 | 3/2011 | Hisayasu et al. | |
| 2011/0074271 A1 | 3/2011 | Takeshi et al. | |
| 2011/0074290 A1 | 3/2011 | Sakai et al. | |
| 2011/0074291 A1 | 3/2011 | Osawa et al. | |
| 2011/0089806 A1 | 4/2011 | Suwa et al. | |
| 2011/0156569 A1 | 6/2011 | Osawa | |

FOREIGN PATENT DOCUMENTS

| | | |
|---|---|---|
| DE | 10 2004 042186 | 3/2006 |
| DE | 20 2008 016 231 | 4/2009 |
| EP | 1705421 | 9/2006 |
| EP | 2037633 | 3/2009 |
| EP | 2149742 | 2/2010 |
| JP | 57-152706 | 9/1982 |
| JP | 59-035303 | 2/1984 |
| JP | 61-35216 | 2/1986 |
| JP | 62-190366 | 12/1987 |
| JP | 63-5581 | 1/1988 |
| JP | 63-102265 | 5/1988 |
| JP | 64-7204 | 1/1989 |
| JP | 1-206505 | 8/1989 |
| JP | 2-91105 | 3/1990 |
| JP | 2000-083343 | 3/2000 |
| JP | 2000-173303 | 6/2000 |
| JP | 2001-243809 | 9/2001 |
| JP | 2002-525814 | 8/2002 |
| JP | 2002-280617 | 9/2002 |
| JP | 2003-016808 | 1/2003 |
| JP | 2003-059305 | 2/2003 |
| JP | 2003-59330 | 2/2003 |
| JP | 2003-92022 | 3/2003 |
| JP | 2004-6096 | 1/2004 |
| JP | 2004-119078 | 4/2004 |
| JP | 2004-193053 | 7/2004 |
| JP | 2004-6096 | 8/2004 |
| JP | 2004-221042 | 8/2004 |
| JP | 2005-93097 | 4/2005 |
| JP | 2005-123200 | 5/2005 |
| JP | 2005-513815 | 5/2005 |
| JP | 2005-166578 | 6/2005 |
| JP | 2005-286267 | 10/2005 |
| JP | 2006-040727 | 2/2006 |
| JP | 3121916 | 5/2006 |
| JP | 2006-156187 | 6/2006 |
| JP | 2006-244725 | 9/2006 |
| JP | 2006-310057 | 11/2006 |
| JP | 2006-313717 | 11/2006 |
| JP | 2006-313718 | 11/2006 |
| JP | 2007-073306 | 3/2007 |
| JP | 2007-188832 | 7/2007 |
| JP | 2007-207576 | 8/2007 |

| | | |
|---|---|---|
| JP | 2008-027910 | 2/2008 |
| JP | 2008-91140 | 4/2008 |
| JP | 2008-227412 | 9/2008 |
| JP | 2008-277561 | 11/2008 |
| JP | 2009-037995 | 2/2009 |
| JP | 2009-37995 | 2/2009 |
| JP | 2009-117342 | 5/2009 |
| JP | 2009117342 A * | 5/2009 |
| JP | 2009-135026 | 6/2009 |
| JP | 2009-206104 | 8/2009 |
| WO | WO 03/056636 | 7/2003 |
| WO | WO 2005/024898 | 3/2005 |
| WO | WO 2008/146694 | 12/2008 |
| WO | WO 2009/087897 | 7/2009 |

OTHER PUBLICATIONS

English Language Abstract of JP Publication 01-206505 published Aug. 18, 1989.
English Language Abstract of JP Publication 2005-093097 published Apr. 7, 2005.
English Language Abstract of JP Publication 2005-123200 published May 12, 2005.
English Language Abstract of JP 2006-313718, published Nov. 16, 2006.
English Language Abstract of JP Publication 63-005581 published Jan. 11, 1988.
English Language Abstract of JP Publication 64-007402 published Jan. 11, 1989.
English Language Machine Translation of JP 2000-083343, published Mar. 21, 2000.
English Language Machine Translation of JP 2000-173303 published Jun. 23, 2000.
English Language Machine Translation of JP 2001-243809, published Sep. 7, 2001.
English Language Machine translation of JP 2003-59330 published Feb. 28, 2003.
English Language Machine Translation of JP 2004-006096 published Jan. 8, 2004.
English Language Machine Translation of JP 2004-193053 published Jul. 8, 2004.
English Language Machine Translation of JP 2005-166578 published Jun. 23, 2005.
English Language Machine translation of JP 2005-513815 published May 12, 2005.
English Language Machine translation of JP 2006-040727 published Feb. 9, 2006.
English Language Machine Translation of JP 2006-310057, published Nov. 9, 2006.
English Language Machine Translation of JP 2006-313718, published Nov. 16, 2006.
English Language Machine translation of JP 2008-91140 published Apr. 17, 2008.
English Language Machine Translation of JP 2009-37995, published Feb. 19, 2009.
English Language Machine Translation of JP 3121916, published May 10, 2006.
English Language Machine Translation of JP Publication 2005-093097 published Apr. 7, 2005.
English Language Machine Translation of JP Publication 2005-123200.
English Language Machine translation of JP-2002-280617 published Sep. 27, 2002.
English Language Machine translation of JP-2005-286267 published Oct. 13, 2005.
English Language Machine translation of JP-2006-244725 published Sep. 14, 2006.
English Language Machine Translation of JP 2003-092022 published Mar. 28, 2003.
English Language Translation of Office Action issued in corresponding Japanese Appl 2005-221571 on Oct. 20, 2009.
English Language Translation of International Search Report for PCT/JP2008/073436 mailed Mar. 24, 2009.
English translation of Office Action issued in corresponding Japanese Appl 2005-221571 on Jul. 7, 2009.
English translation of Office Action issued in corresponding Japanese Appl 2005-221571 on Aug. 25, 2009.
English Language Translation of Office Action issued in Japanese Appl 2005-221688 on Jan. 26, 2010.
Machine English language translation of JP-2003-016808 published Jan. 17, 2003.
Office Action issued in corresponding Japanese Appl 2005-221571 on Jul. 7, 2009.
Office Action issued in corresponding Japanese Appl 2005-221571 on Aug. 25, 2009.
Office Action issued in corresponding Japanese. Appl 2005-221571 on Oct. 20, 2009.
Search Report of International Application No. PCT/JP2008/068625 mailed Dec. 9, 2008.
English Language Abstract of JP 2004-193053 published Jul. 8, 2004.
English Language Abstract of JP 2-91105 published Mar. 30, 1990.
English Language Abstract of JP 2000-173303 published Jun. 23, 2000.
English Language Abstract of JP 2003-092022 published Mar. 28, 2003.
English language abstract of JP-2002-280617 published Sep. 27, 2002.
English language abstract of JP-2003-016808 published Jan. 17, 2003.
English Language Abstract of 2003-59330 published Feb. 28, 2003.
English Language Abstract of JP 2005-166578 published Jun. 23, 2005.
English language abstract of JP-2005-286267 published Oct. 13, 2005.
English Language Abstract of JP 2006-040727 published Feb. 9, 2006.
English language abstract of JP-2006-244725 published Sep. 14, 2006.
English Language Abstract of JP 2008-91140 published Apr. 17, 2008.
English Language Abstract of JP 2004-006096 published Jan. 8, 2004.
Office Action issued in Japanese Appl 2005-221688 on Jan. 26, 2010.
English Language Abstract of JP 2009-37995, published Feb. 19, 2009.
English Language Abstract of JP 2000-083343, published Mar. 21, 2000.
English Language Abstract of JP 57-152706 published Sep. 21, 1982.
English Language Abstract of JP 2006-310057, published Nov. 9, 2006.
International Preliminary Report on Patentability and Written Opinion issued in PCT/JP2008/068625 mailed May 11, 2010.
Office Action issued in Japanese Appl 2005-371406 on Apr. 20, 2010.
English Translation of Office Action issued in Japanese Appl 2005-371406 on Apr. 20, 2010.
U.S. Appl. No. 12/825,650.
U.S. Appl. No. 12/794,558.
U.S. Appl. No. 12/825,956.
Japanese Office Action issued in JP 2008-198625 on May 26, 2010.
English Translation of Japanese Office Action issued in JP 2008-198625 on May 26, 2010.
Amendment filed in JP 2008-198625 on Jun. 28, 2010.
English Translation of Amendment filed in JP 2008-198625 on Jun. 28, 2010.
English Language Abstract of JP 2006-313717 published Nov. 16, 2006.
Machine English Translation of JP 2006-313717 published Nov. 16, 2006.
English Language Abstract of JP 2009-135026 published Jun. 18, 2009.
English Language Translation of JP 2009-135026 published Jun. 18, 2009.
English Language Abstract of JP 2002-525814 published Aug. 13, 2002.

English Language Abstract of JP 2003-059305 published Feb. 28, 2003.
English Language Translation of JP 2003-059305 published Feb. 28, 2003.
English Language Abstract of JP 2009-037995 published Feb. 19, 2009.
English Language Translation of JP 2009-037995 published Feb. 19, 2009.
English Language Abstract of JP 2007-188832 published Jul. 26, 2007.
English Language Translation of JP 2007-188832 published Jul. 26, 2007.
English Language Abstract of JP 2008-027910 published Feb. 7, 2008.
English Language Translation of JP 2008-027910 published Feb. 7, 2010.
English Language Abstract of JP 2007-207576 published Aug. 16, 2007.
English Language Translation of JP 2007-207576 published Aug. 16, 2007.
English Language Abstract of JP 2007-073306 published Mar. 22, 2007.
English Language Translation of JP 2007-073306 published Mar. 22, 2007.
U.S. Appl. No. 12/880,490.
U.S. Appl. No. 12/885,849.
U.S. Appl. No. 11/399,492 (now U.S. Patent 7,758,223).
Extended European Search Report issued in EP Appl 10006720.6 on Oct. 13, 2010.
English Language Abstract of JP 61-35216 published Feb. 2, 1086.
IPRP & WO issued in PCT/JP2008/073436 on Aug. 10, 2010.
English Language Abstract of JP 2008-227412 published Sep. 25, 2008.
English Language Translation of JP 2008-227412 published Sep. 25, 2008.
Japanese Office Action issued in 2005-269017 on Jan. 13, 2011.
English Language Translation of Japanese Office Action issued in 2005-269017 on Jan. 13, 2011.
English Language Abstract of JP 2004-221042 published Aug. 5, 2004.
English Language Translation of JP 2004-221042 published Aug. 5, 2004.
English Language Abstract of JP 63-102265 published May 7, 1988.
English Language Abstract of JP 2009-206104 published Sep. 10, 2009.
English Language Translation of JP 2009-206104 published Sep. 10, 2009.
European Search Report issued in EP 10178361.1 on Jul. 4, 2011.
U.S. Appl. No. 13/034,959, filed Feb. 25, 2011.
U.S. Appl. No. 13/172,557, filed Jun. 29, 2011.
U.S. Appl. No. 13/221,519, filed Aug. 30, 2011.
U.S. Appl. No. 13/221,551, filed Aug. 30, 2011.
U.S. Appl. No. 13/172,557.
Extended European Search Report issued in EP 111560003.9 on May 18, 2011.
Extended European Search Report issued in EP 08838942.4 on Jun. 1, 2011.
English Language Abstract of JP 2008-277561 published on Nov. 13, 2008.
English Language Translation of JP 2008-277561 published on Nov. 13, 2008.
English Language Translation of JP 2002-525814 published Aug. 13, 2002.
English Language Abstract of JP 2006-156187 published Jun. 15, 2006.
English Language Translation of JP 2006-156187 published Jun. 15, 2006.
U.S. Appl. No. 12/888,921.
U.S. Appl. No. 13/034,959.
U.S. Appl. No. 12/794,379.
U.S. Appl. No. 12/794,429.
U.S. Appl. No. 12/794,476.
U.S. Appl. No. 12/794,509.
U.S. Appl. No. 12/811,795.
U.S. Appl. No. 12/738,081.
U.S. Appl. No. 12/713,230.
U.S. Appl. No. 12/845,330.
U.S. Appl. No. 12/885,005.
U.S. Appl. No. 12/933,969.
U.S. Appl. No. 12/886,025.
U.S. Appl. No. 12/886,123.
U.S. Appl. No. 13/044,369.
U.S. Appl. No. 13/221,519.
U.S. Appl. No. 13/221,551.
Chinese of Action issued in CN 201010216943 on Oct. 26, 2011.
English Language Translation of Chinese Office Action issued in CN 201010216943 on Oct. 26, 2011.
English Language Abstract of CN 101307887 published Nov. 19, 2008.
English Language Translation of JP 2009/117342 published May 28, 2009.
English Language Abstract of JP 2009/117342 published May 28, 2009.
English Language Abstract of JP 2004-119078 published Apr. 15, 2004.
English Language Translation of JP 2004-119078 published Apr. 15, 2004.

* cited by examiner

LIGHT-EMITTING ELEMENT LAMP AND LIGHTING EQUIPMENT

TECHNICAL FIELD

The present invention relates to a light-emitting element lamp to which light-emitting elements such as LEDs are applied as a light source, and lighting equipment using the light-emitting element lamp.

BACKGROUND ART

In regard to the light-emitting element such as an LED, an increase in temperature thereof results in a lowering in optical output and adversely influences the service life. Therefore, in a lamp in which a solid-state light-emitting element such as an LED and EL element are used as its light source, it is necessary to prevent the temperature of the light-emitting element from rising in order to improve various characteristics such as service life and efficiency. Conventionally, in this type of LED lamp, such a type of LED lamp has been known which is provided with a columnar radiator between a substrate having LEDs disposed thereon and a cap and the substrate is attached to the peripheral edge at the end face of the radiator (For example, refer to Patent Document 1).

PATENT CITATION

Patent Citation 1: Japanese Laid-Open Patent Publication No. 2005-286267

SUMMARY OF INVENTION

Technical Problem

However, the type shown in Patent Document 1 is such that a radiator is specially provided as a countermeasure for heat radiation, and further is shaped so that the substrate is brought into contact with only the peripheral edge of the end face of the radiator. In other words, the radiator is brought into only linear contact with the substrate, wherein it is difficult that a sufficient radiation effect is obtained.

The present invention was developed in view of the above-described problems and it is an object of the present invention to provide a light-emitting element lamp and lighting equipment in which a temperature rise of the substrate having light-emitting elements mounted thereon can be effectively prevented by using a thermally conductive casing and cover.

Technical Solution

A light-emitting element lamp according to a first embodiment of the present invention includes a thermally conductive casing having an irradiation opening, which is formed so as to be widened toward the irradiation opening, having an outer circumferential surface exposed outwardly, and having a substrate mounting part equipped on the inner circumferential surface; a light source part having a substrate having light-emitting elements mounted thereon, in which the substrate is attached so as to be thermally coupled to the substrate mounting part; a thermally conductive cover which is thermally coupled to and connected to the outer circumferential surface of the thermally conductive casing in a surface-contacted state; an insulative cover one end side of which is connected to the thermally conductive cover and the other end side of which has a cap connected thereto; and a lighting circuit which is accommodated in the insulative cover and controls lighting of the light-emitting elements.

The light-emitting element is a solid-state light-emitting element such as an LED (light-emitting diode) and an organic EL (electro-luminescence). It is preferable that the light-emitting element is mounted by a chip-on-board system and a surface-mounting system. However, the mounting system is not specially restricted in consideration of the features of the present invention. For example, a bullet type LED may be used and mounted on a substrate. Also, there is no special restriction on the number of light-emitting elements to be disposed. The thermally conductive casing maybe widened toward the irradiation opening continuously or stepwise. In other words, the casing may be widened with a non-continuous shape.

A light-emitting element lamp according to a second embodiment of the present invention is featured, in addition to the light-emitting element lamp described in the first embodiment of the present invention, in that the thermally conductive casing and the thermally conductive cover are connected to each other with an O-ring intervening therebetween, and power is fed from the lighting circuit to the light source part inside the O-ring.

A light-emitting element lamp according to a third of the present invention is featured, in addition to the light-emitting element lamp described in the first or second embodiments of the present invention, in that a plurality of light-emitting elements are mounted on the substrate, and a reflector is provided opposite to the substrate, and the reflector includes a plurality of incidence openings corresponding to the plurality of light-emitting elements and a reflection surface which sections the incidence openings and is widened from the incidence openings toward the irradiation direction.

Lighting equipment according to a fourth embodiment of the present invention includes an equipment main body having a socket, and a light-emitting element lamp described in the first or second embodiments of the present invention, which is mounted in the socket of the equipment main body.

Advantageous Effects

According to a first embodiment of the present invention, a temperature rise of the substrate having light-emitting elements mounted thereon can be effectively prevented by using the thermally conductive casing and the thermally conductive cover. Further, since the thermally conductive casing is widened toward the irradiation opening, and the area of the outer circumferential surface which brings about a heat radiation effect is large, the casing is effective in the heat radiation effect. Furthermore, since the thermally conductive casing and the thermally conductive cover are brought into surface contact with each other, the thermal conduction is improved.

According to a second embodiment of the present invention, a waterproof feature is maintained with a simple structure, and a power feeding channel to the light source part can be secured, in addition to the effects of the present invention, which are described in the first embodiment of the present invention.

According to of the present invention, in addition to the effects of the first or second embodiments of the present invention, light distribution control is enabled by the reflection surface of the reflector per light-emitting element, wherein desired optical treatment can be carried out without any other light control means provided.

According to a fourth embodiment of the invention, in addition to the effects which are brought about by the light-emitting, element lamp, it is possible to provide lighting equipment capable of effectively radiating heat by transmitting heat from the cap to the socket.

DESCRIPTION OF EMBODIMENTS

Figure 1:
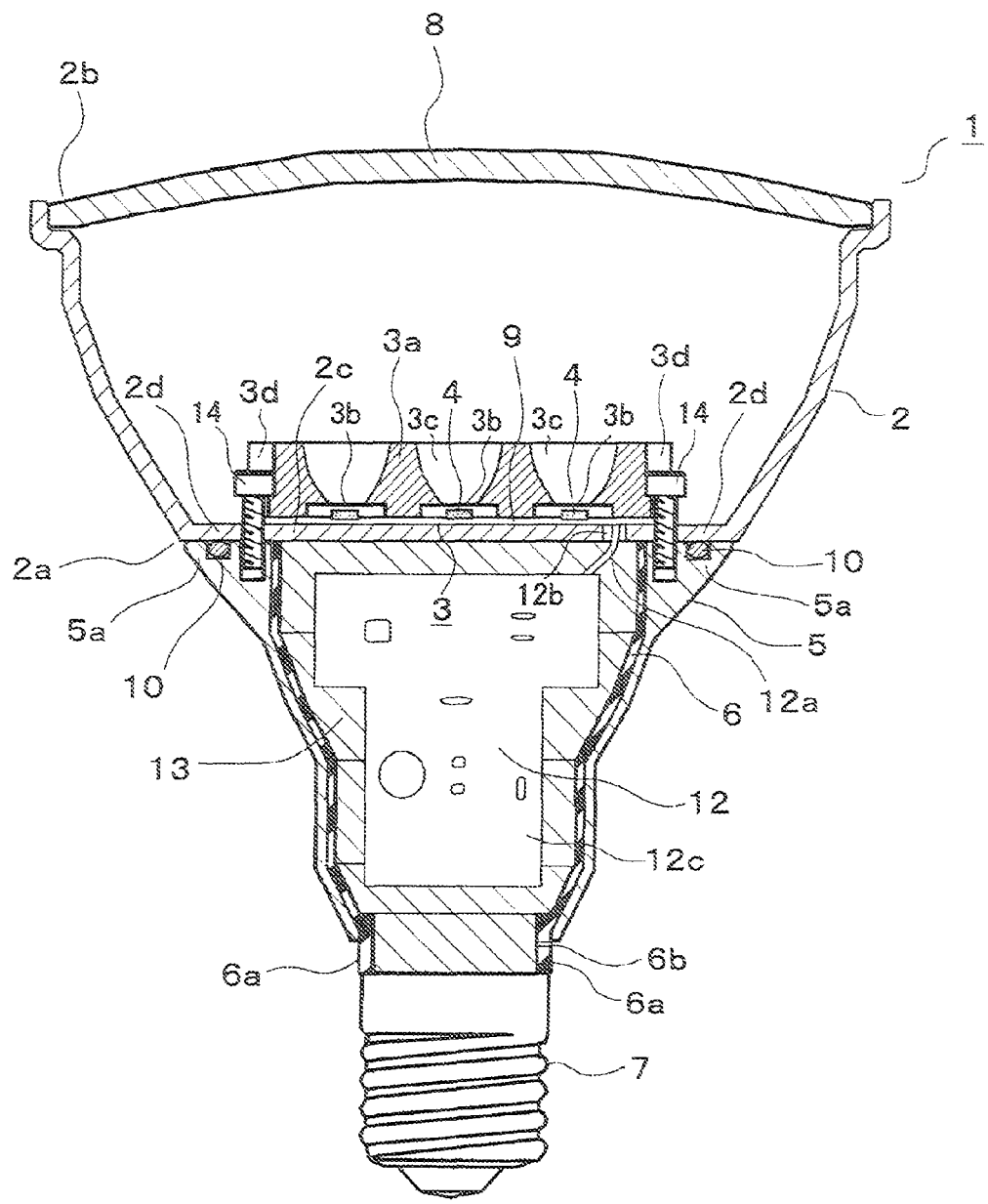
FIG. 1 is a sectional view showing a light-emitting element lamp according to an embodiment of the present invention.
Figure 2:
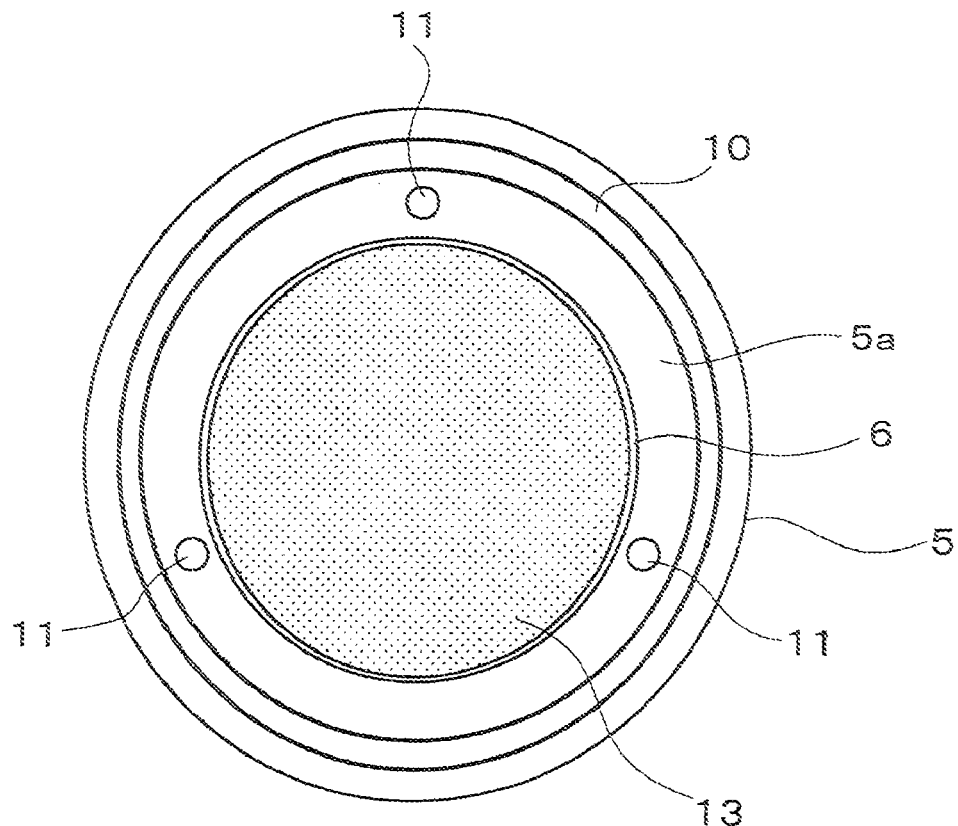
FIG. 2 is a plan view showing the same light-emitting element lamp with the thermally conductive casing removed.
Figure 3:
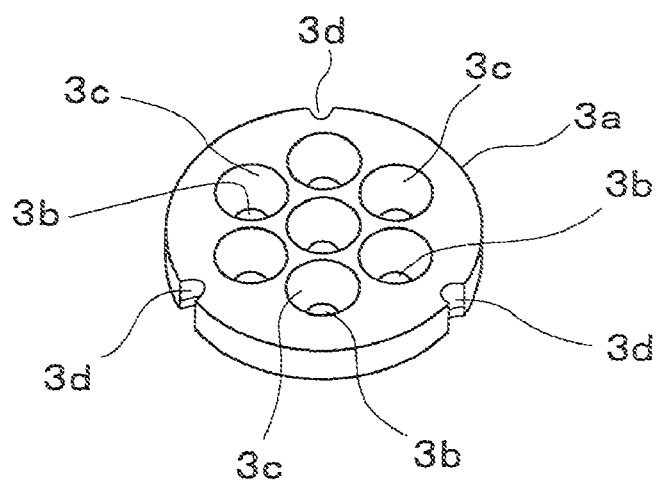
FIG. 3 is a perspective view showing a reflector of the same light-emitting element lamp.
Figure 4:
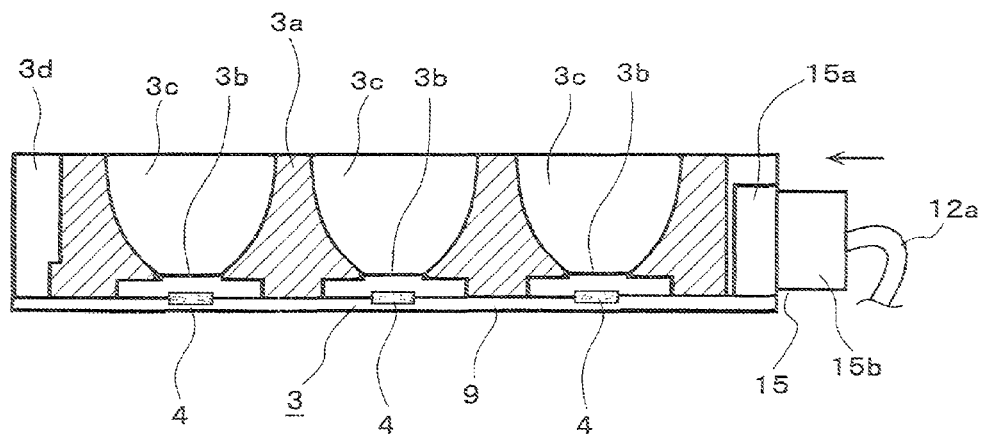
FIG. 4 is a sectional view showing a reflector of the same light-emitting element lamp.

Hereinafter, a description is given of a light-emitting element lamp according to the embodiment of the present invention with reference to FIG. 1 through FIG. 4. FIG. 1 is a sectional view showing the light-emitting element lamp, FIG. 2 is a plan view showing the same light-emitting element lamp with the thermally conductive casing removed, FIG. 3 is a perspective view showing a reflector of the same light-emitting element lamp, and FIG. 4 is a sectional view showing a reflector of the same light-emitting element lamp. The light-emitting element lamp according to the present embodiment can replace the existing reflection type incandescent lamp or a so called beam lamp and has a structure roughly equivalent to the beam lamp in respect to the appearance dimension. The beam lamp is suitable as a store spot light, projection illumination of buildings and advertisement sign boards, and illumination of construction sites, etc.

In FIG. 1, the light-emitting element lamp 1 has an appearance profile similar to the existing beam lamp, and has a waterproof feature by which the light-emitting element lamp 1 can be used outdoors. The light-emitting element lamp 1 is provided with a thermally conductive casing 2, a light source part 3, a reflector 3a, light-emitting elements 4, a thermally conductive cover 5, an insulative cover 6, a cap 7, and a front side lens 8 serving as a transparent cover.

The thermally conductive casing 2 is composed of, for example, an integrally molded article of aluminum, and the surface thereof is baking-finished with white acryl. The casing 2 is widened from the base end part 2a toward the irradiation opening 2b, and is formed to be like a bowl having a bottom so that the outer circumferential surface is exposed outwardly. The bottom wall of the inner circumferential surface of the thermally conductive casing 2 is formed to be flat, where the substrate mounting part 2c is formed. On the other hand, the bottom wall peripheral edge of the outer circumferential surface forms an annular connection part 2d which is connected to the thermally conductive cover 5. In addition, screw through-holes are formed at three points with a gap of approximately 120 degrees in the circumferential direction in the bottom wall of the thermally conductive casing 2. Further, the substrate mounting part 2c is formed to be separate from the thermally conductive casing 2, and the substrate mounting part 2c which is formed separately from the casing 2 may be attached so as to be thermally coupled to the thermally conductive casing 2. Still further, the material of the thermally conductive casing 2 is not limited to aluminum, wherein a metallic material or a resin material which has favorable thermal conductivity may be used. In addition, it is preferable that the inner circumferential surface of the thermally conductive casing 2 may be alumite-treated. By executing alumite treatment, it becomes possible to increase the heat radiation effect of the thermally conductive casing 2. If alumite treatment is executed, the inner circumferential surface of the thermally conductive casing 2 lowers in the reflection effect. However, since the reflector 3a is separately provided, a lowering in the reflection effect does not hinder the performance. On the other hand, where the inner circumferential surface of the thermally conductive casing 2 is used as the reflection surface, a reflection surface may be formed by mirror-like finishing, etc.

The light source part 3 is provided on the bottom wall of the thermally conductive casing 2. The light source part 3 is provided with a substrate 9 and light-emitting elements 4 mounted on the substrate 9. The light-emitting elements 4 are LED chips. The LED chips are mounted on the substrate 9 by the chip-on-board system. That is, the LED chips are disposed in the form of a plurality of matrices on the surface of the substrate 9 and are structured so that the surface thereof is coated with a coating material. The substrate 9 is composed of a roughly circular flat plate formed of metal, for example, a material which is good in thermal conductivity and excellent in heat radiation properties, such as aluminum. Where the substrate 9 is an insulative material, a ceramic material or a synthetic resin material which is comparatively good in heat radiation properties and excel lent in durability may be applied. Where a synthetic resin material is used, for example, the substrate 9 may be formed of, for example, a glass epoxy resin.

And, the substrate 9 is attached so as to be brought into surface contact with and be adhered to the substrate mounting part 2c formed on the bottom wall of the thermally conductive casing 2. When attaching the substrate 9, an adhesive glue may be used. Where an adhesive glue is used, it is preferable that a material having favorable thermal conductivity, in which a metallic oxide substance, etc., is mixed in a silicone resin-based adhesive glue is used. Also, the surface contact between the substrate 9 and the base mounting part 2c does not have to be an entire surface contact but may be a partial surface contact.

A reflector 3a formed of white polycarbonate or ASA resin, etc., is disposed on the surface side of the substrate 9. The reflector 3a functions to control the distribution of light emitted from the LED chips and to efficiently irradiate the light. The reflector 3a is formed to be disk-shaped, and is sectioned by ridge line parts to form a plurality of incidence openings 3b. The incidence openings 3b of the reflector 3a are disposed so as to be opposed to respective LED chips of the substrate 9. Therefore, a roughly bowl-shaped reflection surface 3c widened in the irradiation direction, that is, toward the ridge line part from the incidence openings 3b is formed per incidence opening 3b. Also, a notched part 3d in which a screw is inserted and locked is formed at three points with a gap of approximately 120 degrees in the circumferential direction on the outer circumferential part of the reflector 3a.

Next, the thermally conductive cover 5 is made of aluminum die-casting. The surface thereof is baking-finished with white acryl, and is made roughly cylindrical so that the cover 5 is tapered continuously with the outer circumferential surface of the thermally conductive casing 2. Further, the length and thickness dimensions of the thermally conductive cover 5 may be appropriately determined with the heat radiation effect, etc., taken into consideration. The connection part 5a of the thermally conductive cover 5 with the thermally conductive casing 2 is formed to be annular with a predetermined width (Refer to FIG. 2). Accordingly, the connection part 2d of the thermally conductive casing 2 is formed to be opposed to the corresponding connection part 5a, and they are thermally coupled and connected to each other in a surface-contacted state. An annular groove is formed in the connection part 5a. An O-ring 10 made of synthetic rubber, etc., is fitted in the groove. Three screw holes 11 are formed with a gap of approximately 120 degrees in the circumferential direction inside the O-ring 10.

An insulative cover 6 molded by PBT resin is provided along the shape of the thermally conductive cover 5 inside the thermally conductive cover 5. Therefore, the insulative cover 6 has one end side thereof connected to the thermally conductive cover 5 and the other end side thereof protruded from the thermally conductive cover 5. A cap 7 is fixed at a protrusion part 6a of the insulative cover 6, which protrudes from the thermally conductive cover 5. The cap 7 is an E26 cap according to the cap standard, and is a portion which is screwed in a socket of lighting equipment when mounting the light-emitting element lamp 1 in the lighting equipment. Also, an air hole 6b is formed in the protrusion part 6a. The air hole 6b is a small hole which functions to reduce the inside pressure when the inside pressure in the insulative cover 6 is increased.

Next, a lighting circuit 12 is accommodated in the insulative cover 6. The lighting circuit 12 controls lighting of the LED chips and is composed of components such as capacitors and transistors as switching elements. The lighting circuit 12 is mounted on the circuit substrate 12c, and the circuit substrate 12c is roughly T-shaped and is accommodated in the longitudinal direction in the insulative cover 6. Accordingly, this makes it possible that the circuit substrate 12c is effectively disposed utilizing a narrow space. In addition, a lead wire 12a is led from the lighting circuit 12, and the lead wire 12a is electrically connected to the substrate 9 of the light source part 3 via a lead wire insertion hole 12b formed in the substrate mounting part 2c. Further, the lighting circuit 12 is electrically connected to the cap 7 (illustration thereof omitted). Also, the entirety of the lighting circuit 12 may be accommodated in the insulative cover 6, or may be partially accommodated therein, and the remaining part thereof may be accommodated in the cap 7.

A filling material 13 is filled up in the insulative cover 6 so as to include and cover the lighting circuit 12. The filling material 13 is made of silicone resin and has resiliency, insulation properties and thermal conductivity. When filling up the filling material 13, a liquid filling material 13 is first poured into the insulative cover 6 from upward. The filling material 13 is poured to the upper end part level of the insulative cover 6 and is hardened and stabilized in a high temperature atmosphere.

Next, the front lens 8 is attached so that it encloses the irradiation opening 2b of the thermally conductive casing 2 in an airtight state via a packing (not illustrated) made of silicone resin. Further, there is a light condensing type and a light scattering type for the front lens 8, which may be appropriately selected for use.

Next, a description is given of a connection state between the thermally conductive casing 2 and the thermally conductive cover 5. A connection part 2d of the thermally conductive casing 2 is disposed so as to be opposed to the connection part 5a of the thermally conductive cover 5. And, the substrate 9 is disposed at the substrate mounting part 2c of the thermally conductive casing 2, and the reflector 3a is caused to overlap thereon. Then, the screw 14 is screwed in the screw hole 11 of the thermally conductive cover 5 via the notched part 3d of the reflector 3a and the screw through-hole of the thermally conductive casing 2, wherein the thermally conductive casing 2 is fixed at the thermally conductive cover 5, and the lower end of the reflector 3a presses the surface side of the substrate 9, and both the reflector 3a and the substrate 9 are fixed at the bottom wall of the thermally conductive casing 2. In such a state, the O-ring 10 is resiliently deformed between the connection part 5a and the connection part 2d and makes the gap therebetween airtight. That is, the inside of the O-ring 10 is kept airtight. Therefore, wiring such as electrical connections by means of lead wires 12a between the lighting circuit 12 and the substrate 9 having the LED chips mounted thereon is carried out inside the O-ring 10.

In FIG. 4, a connector 15 is provided at the outer circumferential edge of the substrate 9 having the LED chips mounted thereon. The connector 15 is composed of a power receiving terminal 15a connected to the wiring pattern of the substrate 9 and a power feeding terminal 15b connected from the wiring pattern of the lighting circuit 12 via the lead wire 12a and forms a socket shape. In this case, the wiring is carried out inside the O-ring 10, wherein sealing properties of the electrically connected portion can be maintained. In addition, since the connector 15 is disposed In the horizontal direction and is connected from the horizontal direction, the height dimension thereof is made lower than the reflector 3a, and there is no case where the connector 15 blocks light irradiated from the reflector 3a.

A description is given of actions of the light-emitting element lamp 1 thus composed. When the cap 7 is mounted in the socket of lighting equipment and power is supplied thereto, the lighting circuit 12 operates to feed power to the substrate 9. Then, the LED chips emit light. Light emitted from the LED chips is controlled by the reflection surface 3c of the reflector 3a mainly per LED chip with respect to the distribution of light, and is irradiated forward, passing through the front lens 8. Heat generated from the LED chips in line therewith is transmitted from roughly the entire surface of the rear surface of the substrate 9 to the substrate mounting part 2c, and is further transmitted to the thermally conductive casing 2 having a larger heat radiation area. Still further, the heat is transmitted from the connection part 2d of the thermally conductive casing 2 to the connection part 5a of the thermally conductive cover 5, and is further transmitted to the entirety of the thermally conductive cover 5. Thus, the respective members are thermally coupled to each other, wherein it is possible to prevent the temperature rise of the substrate 9 by the above-described thermal transmission channel and radiation. On the other hand, heat generated from the light circuit 12 is transmitted to the thermally conductive casing 2 via the filling material 13 and is radiated therefrom, and is further transmitted to the cap 7 and still further transmitted from the cap 7 to the socket, etc., of the lighting equipment and is radiated therefrom.

Further, in the light-emitting element lamp 1 according to the present embodiment, the front lens 8 is attached to the irradiation opening 2b of the thermally conductive casing 2 via packing, and the O-ring 10 is provided between the connection part 2d of the thermally conductive casing 2 and the connection part 5a of the thermally conductive cover 5. In addition, the lighting circuit 12 is enclosed by the filling material 13. Accordingly, since the light-emitting element lamp 1 has electric insulation properties and has weather resistance and rainproof features, the light-emitting element lamp 1 is structured so as to be suitable for outdoor use. Further, such a sealing structure is adopted for this reason. However, if any one of the lighting circuit components becomes abnormal, and temporarily the capacitor becomes damaged or broken, and the inside pressure of the insulative cover 6 is increased, there is a possibility for secondary damage to be brought about. However, it is possible to discharge increased pressure in the insulative cover 6 through the air hole 6b.

According to the present embodiment described above, the light distribution is controlled by the reflection surface 3c of the reflector 3a per LED chip, wherein desired optical treatment can be carried out without using other light control means. In addition, it is possible to effectively prevent the temperature rise of the substrate 9 having the light-emitting elements 4 mounted thereon by utilizing the thermally conductive casing 2 and the thermally conductive cover 5. Further, since the thermally conductive casing 2 is widened toward the irradiation opening 2b, the area of the outer circumferential surface which brings about heat radiation effect, and the casing 2 is effective for the heat radiation effect. Still further, since the thermally conductive casing 2 and the thermally conductive cover 5 are brought into surface contact with each other, the thermal conduction becomes favorable. Also, since the O-ring 10 is provided between the connection part 2d of the thermally conductive casing 2 and the connection part 5a of the thermally conductive cover 5 to keep sealing properties, it is possible to secure a power feeding channel to the light source part 3 with the waterproof features maintained by a simple structure. In addition, since components of the existing so-called beam light can be used, the components can be commonly utilized, and it is possible to provide an inexpensive light-emitting element lamp 1.

Figure 5:
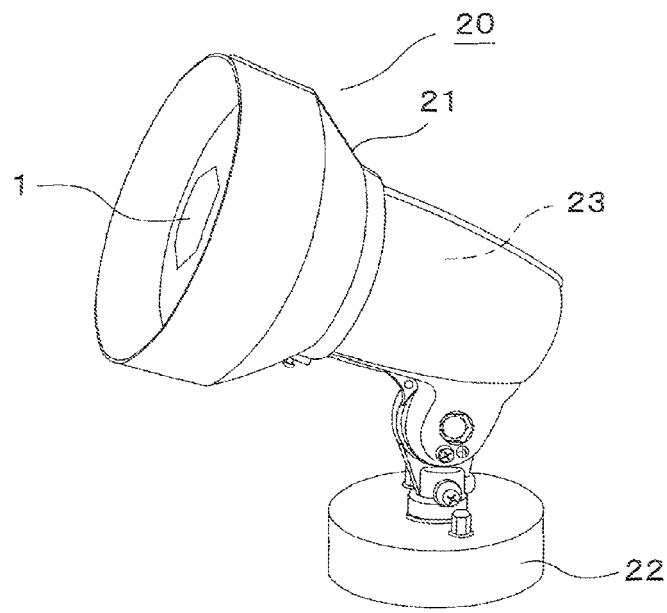
FIG. 5 is a perspective view showing lighting equipment according to the embodiment of the present invention.

Next, a description is given of an embodiment of lighting equipment in which the light-emitting element lamp 1 is used as a light source, with reference to a perspective view of FIG. 5. The lighting equipment 20 is a spot light for outdoor use. The lighting equipment 20 is provided with an equipment main body 21 and a base 22 on which the equipment main body 21 is mounted. A socket 23 is provided in the equipment main body 21. The cap 7 of the light-emitting element lamp 1 is screwed in and mounted in the socket 23. In addition, the lighting equipment 20 is fixed with the base 22 thereof fixed on the ground, etc., and the direction of the equipment main body 21 is variable with respect to the base 22, and the irradiation direction of light can be optionally changed. According to such lighting equipment 20, temperature rise of the substrate 9 of the light-emitting element lamp 1 can be effectively prevented by utilizing the thermally conductive casing 2 and the thermally conductive cover 5, and heat generated from the lighting circuit 12 is mainly transmitted to the cap 7, transmitted from the cap 7 to the socket 23, etc., of the lighting equipment 20 and is radiated therefrom, wherein it is possible to provide lighting equipment 20 capable of further effectively preventing a temperature rise of the substrate 9.

Also, in the present invention, it is not requisite that components of the existing beam light are used.

INDUSTRIAL APPLICABILITY

The present invention is applicable to a light-emitting element lamp, in which light-emitting elements such as LEDs are used as a light source, and lighting equipment in which the light-emitting element lamp is used.

EXPLANATION OF REFERENCE

1 Light-emitting element lamp
2 Thermally conductive casing
2b Irradiation opening
2c Substrate mounting part
3 Light source part
3a Reflector
3b Incidence opening
3c Reflection surface
4 Light-emitting element
5 Thermally conductive cover
6 Insulative cover
7 Cap
9 Substrate
10 O-ring
12 Lighting circuit
20 Lighting equipment
21 Equipment main body
23 Socket

The invention claimed is:

1. A light-emitting element lamp including:
a thermally conductive substrate mounting part comprising a screw through-hole and an outer circumferential surface exposed outwardly;
a light source part comprising a substrate with light-emitting elements mounted thereon, the substrate being attached to the substrate mounting part so as to be thermally coupled to the substrate mounting part;
a thermally conductive cover comprising a first end with an annular connection part and a second end, the annular connection part being thermally coupled to and connected to the substrate mounting part, wherein a screw hole is disposed in the cover at a position opposing the screw through-hole of substrate mounting part, the cover is tapered radially inward from the first end to the second end, and a width of an inner space defined by an inside of the cover decreases from a portion of the inner space near the first end to a portion of the inner space near the second end;
an insulative cover comprising a first end and a second end, wherein the first end is connected to the thermally conductive cover and the second end comprises a cap connected thereto;
a lighting circuit which is accommodated in the insulative cover and is configured to control lighting of the light-emitting elements; and
a screw which is screwed in the screw hole of the thermally conductive cover via the screw through-hole of the substrate mounting part, the screw pressing and fixing the substrate mounting part against the connection part of the thermally conductive cover.

2. The light-emitting element lamp according to claim 1, wherein an annular groove is formed in the connection part of the thermally conductive cover, an O-ring is fitted in the groove, and the O-ring is pressed against the substrate mounting part and resiliently deformed.

3. Lighting equipment including:
an equipment main body comprising a socket;
a light-emitting element lamp according to claim 1, which is mounted in the socket of the equipment main body.

4. Lighting equipment including:
an equipment main body comprising a socket;
a light-emitting element lamp according to claim 2, which is mounted in the socket of the equipment main body, 5. The light-emitting element lamp according to claim 1, wherein the screw presses and fixes the light source part against the connection part of the thermally conductive cover together with the substrate mounting part.

* * * * *